United States Patent [19]
Yoshihisa et al.

[11] Patent Number: 5,693,543
[45] Date of Patent: Dec. 2, 1997

[54] METHOD OF MANUFACTURING A SEMICONDUCTOR IIL DEVICE WITH DIELECTRIC AND DIFFUSION ISOLATION

[75] Inventors: Yasuki Yoshihisa; Masaaki Ikegami, both of Hyogo, Japan

[73] Assignee: Mitsubishi Denki Kabushiki Kaisha, Tokyo, Japan

[21] Appl. No.: 540,372

[22] Filed: Nov. 17, 1995

Related U.S. Application Data

[62] Division of Ser. No. 264,119, Jun. 22, 1994, Pat. No. 5,481,130.

[30] Foreign Application Priority Data

Feb. 21, 1994 [JP] Japan ......................... 6-22571

[51] Int. Cl.$^6$ ................................................ H01L 21/265
[52] U.S. Cl. .................. 437/31; 437/34; 437/55; 437/61; 437/70
[58] Field of Search ....................... 437/31, 34, 55, 437/61, 64, 69, 70

[56] References Cited

U.S. PATENT DOCUMENTS

| | | | |
|---|---|---|---|
| 4,115,797 | 9/1978 | Hingarh et al. | 437/55 |
| 4,260,430 | 4/1981 | Itoh et al. | 437/55 |
| 4,274,891 | 6/1981 | Silvestri et al. | 437/55 |
| 4,338,139 | 7/1982 | Shinada . | |
| 4,377,903 | 3/1983 | Kanzaki et al. . | |
| 4,512,075 | 4/1985 | Vora . | |
| 4,539,742 | 9/1985 | Kamzaki et al. | 437/55 |
| 4,546,539 | 10/1985 | Beasom | 437/55 |
| 4,550,491 | 11/1985 | Depey | 437/55 |
| 5,331,198 | 7/1994 | Kanda et al. . | |

FOREIGN PATENT DOCUMENTS

| | | |
|---|---|---|
| 54-142080 | 11/1979 | Japan . |
| 60-101961 | 6/1985 | Japan . |
| 62-274769 | 11/1987 | Japan . |

OTHER PUBLICATIONS

Wiedmann et al., "High-Speed Split-Emitter I$^2$L/MTS Memory Cell," IEEE Journal of Solid-State Circuits, vol. SC-16, No. 5, Oct. 1981, pp. 429-434.

Crippen et al., "High-Performance Integrated Injection Logic: A Microprogram Sequencer Built with I$^3$L," IEEE Journal of Solid-State Circuits, vol. SC-11, No. 5, Oct. 1976, pp. 662-668.

Journal of Institute of Electronics, Information and Communication Engineers of Japan, Feb. 1978, pp. 192-193.

*Primary Examiner*—Tuan H. Nguyen
*Attorney, Agent, or Firm*—Lowe, Price, LeBlanc & Becker

[57] ABSTRACT n type epitaxial layers are formed on the main surface of a p type semiconductor substrate. A field oxide film is selectively formed in the surface of n type epitaxial layers. An n type diffusion region is formed in n type epitaxial layers positioned directly under field oxide film. A base region and a collector region are respectively formed in the surface of n type epitaxial layer positioned between field oxide films. As a result, a semiconductor device having an IIL circuit is obtained which can suppress the parasitic bipolar operation between base regions, reduce the junction capacitance between the base region and the emitter region and which can be reduced in size.

4 Claims, 19 Drawing Sheets

METHOD OF MANUFACTURING A SEMICONDUCTOR IIL DEVICE WITH DIELECTRIC AND DIFFUSION ISOLATION

This application is a division of application Ser. No. 08/264,119 filed Jun. 22, 1994, now U.S. Pat. No. 5,481,130.

BACKGROUND OF THE INVENTION

1. Field of the Invention

The present invention relates mainly to a semiconductor device having an IIL (Integrated Injection Logic) circuit and a method of manufacturing the same.

2. Description of the Background Art

An IIL circuit is conventionally known as a saturation type logic circuit. The IIL circuit gives a simple circuit structure, low power consumption, and high density.

The IIL circuit will now be described briefly with reference to FIG. 20. FIG. 20 is an equivalent circuit diagram showing an example of the IIL circuit.

Referring to FIG. 20, the IIL circuit is configured of a lateral pnp transistor Q1 serving as current source, and a vertical npn transistor Q2 for operation as an inverter. The base region of pnp transistor Q1 serves also as the emitter region of npn transistor Q2. The collector region of pnp transistor Q1 serves also as the base region of npn transistor Q2. In the IIL circuit, plural collector regions may be formed in npn transistor Q2.

The operation of the IIL circuit shown in FIG. 20 will now be described. Referring again to FIG. 20, minority carriers are first injected from the emitter region into the base region of pnp transistor Q1. A large part of the minority carriers flows to a region serving both as the collector region of pnp transistor Q1 and the base region of npn transistor Q2. pnp transistor Q1 operates as a transistor whose base region is grounded.

On the other hand, when an input terminal IN connected to the base region of npn transistor Q2 is at a relatively high potential or in a floating state, npn transistor Q2 corresponding to the terminal is supplied at its base with the minority carriers from pnp transistor Q1 to be saturated. As a result, ground potential appears at an output terminal OUT. When the input terminal IN is at the ground potential (0V), the minority carriers flow out from the input terminal IN. As a result, npn transistor Q2 is turned off.

Description will now be given of a cross sectional structure of a semiconductor device having such an IIL circuit as described above. FIG. 21 is a partial cross sectional view showing an example of a semiconductor device having a conventional IIL circuit. In the semiconductor device having an IIL circuit of FIG. 21, a field oxide film 106 is formed for isolating adjacent base regions 107. FIG. 22 is a partial cross sectional view of a semiconductor device having an IIL circuit in which adjacent base regions are isolated by an n$^+$ emitter collar region 109.

Referring to FIG. 21, n type epitaxial layers 104, 104a are formed on the main surface of a p type semiconductor substrate 101. An n type buried layer 103 is formed in n type epitaxial layer 104a and in the main surface of p type semiconductor substrate 101. A p type buried isolation region 102 is formed so as to surround n type buried layer 103. A p type isolation region 105 is formed on p type buried isolation region 102.

Field oxide film 106 is selectively formed on the surface of n type epitaxial layers 104–104a. A p type base region 107 is formed at a predetermined position between field oxide films 106. An n type collector region 108 is formed in the surface of p type base region 107.

Description will now be given of a semiconductor device having an IIL circuit in which n$^+$ emitter collar region 109 isolates adjacent base regions 107, taken as a comparison example. Referring to FIG. 22, in the semiconductor device having an IIL circuit shown in the figure, n$^+$ emitter collar region 109 rather than field oxide film 106 is formed at a predetermined region of the surface of n type epitaxial layer 104a. The semiconductor device shown in FIG. 22 is the same as the semiconductor device having an IIL circuit shown in FIG. 21.

In the semiconductor device having an IIL circuit shown in FIG. 22, since emitter collar region 109 is formed, it is possible to suppress the parasitic pnp effect between adjacent base regions 107. In addition to this, it is possible to reduce the width W between adjacent base regions 107, and to reduce an element in size.

The semiconductor device having an IIL circuit shown in FIG. 22 had, however, such problems as described below.

Referring again to FIG. 22, the above-described emitter collar region 109 is formed so as to be sandwiched by adjacent base regions 107. The concentration of emitter collar region 109 is $10^{19}$–$10^{20}$ cm$^{-3}$, which is relatively high. Because of the concentration of emitter collar region 109, the concentration of epitaxial layer 104a between base regions 107 also becomes high. Therefore, the junction capacitance between epitaxial layer (emitter region) 104a and base region 107 increases, and the operation speed of the IIL circuit is lowered. This problem is described, for example, in the *Journal of Institute of Electronics, Information and Communication Engineers of Japan* of February, 1978.

On the other hand, in the structure shown in FIG. 21, since base regions 107 are isolated from each other only by field oxide film 106, the concentration of epitaxial layer 104a in the vicinity of base region 107 is suppressed. The junction area of base region 107 and epitaxial layer 104a is also small. As a result, the junction capacitance between base region 107 and epitaxial layer 104a can be suppressed, resulting in a semiconductor device having an IIL circuit having an improved operation speed. Furthermore, because of field oxide film 106, the parasitic pnp operation between base regions 107 can also be suppressed.

Because of the above, the structure shown in FIG. 21 in which base regions 107 are isolated from each other by field oxide film 106 is more preferable from the standpoint of performance.

In view of the above, description will now be given of a method of manufacturing the semiconductor device having an IIL circuit shown in FIG. 21 with reference to FIGS. 23 to 27. FIGS. 23 to 27 are cross sectional views showing the first to the fifth steps of the manufacturing process of the semiconductor device having an IIL circuit shown in FIG. 21.

Referring to FIG. 23, n type impurity region 103 is formed by introducing n type impurity into a predetermined region in the main surface of p type semiconductor substrate 101. Then, p type impurity region 102 is formed by introducing p type impurity into a predetermined region in the main surface of p type semiconductor substrate 101.

Referring to FIG. 24, n type epitaxial layers 104, 104a are formed on the main surface of p type semiconductor substrate 101 with an epitaxial growth method. Then, n type buried layer 103 and p type buried isolation region 102 are respectively formed. p type isolation region 105 is formed in n type epitaxial layers 104, 104a positioned on p type buried isolation region 102 using an ion implantation method or diffusion method.

Referring to FIG. 25, a silicon oxide film 111 and a silicon nitride film 112 are sequentially deposited on the entire surface of n type epitaxial layers 104, 104a using a CVD (Chemical Vapor Deposition) method or the like. A resist pattern 113 patterned into a predetermined shape is deposited on silicon nitride film 112. With resist pattern 113 used as a mask, silicon nitride film 112 is patterned. Then, resist pattern 113 is removed.

Referring to FIG. 26, with the above-described stacked structure of silicon oxide film 111 and silicon nitride film 112 used as a mask, field oxide film 106 is formed in the surface of n type epitaxial layers 104, 104a with an LOCOS (Local Oxidation of Silicon) method. The thickness of field oxide film 106 is approximately 1.5 μm.

Referring to FIG. 27, with the above-described field oxide film 106 used as a mask, p type impurity such as boron (B) is implanted into the surface of n type epitaxial layers 104, 104a. As a result, p type base region 107 is formed.

By selectively introducing n type impurity such as arsenic (As) into the surface of base region 107, n type collector region 108 is formed in the surface of base region 107. The semiconductor device having an IIL circuit shown in FIG. 21 is thus formed.

In the semiconductor device having an IIL circuit shown in FIG. 21, however, there was such a problem as described below. Referring again to FIG. 21, when base regions 107 are isolated from each other by field oxide film 106, the isolation width W1 between base regions 107 is determined by the parasitic pnp operation (parasitic bipolar operation) between adjacent base regions 107. More specifically, the width W1 between base regions 107 is determined so that the parasitic pnp operation will not occur. As a result, it becomes difficult to reduce the width W1 between base regions 107, which hampers reduction of a semiconductor device having an IIL circuit in size.

SUMMARY OF THE INVENTION

One object of the present invention is to provide a semiconductor device having an IIL circuit which can reduce a junction capacitance between a base region and an emitter region caused by isolation between the base regions, and which can be reduced in size, and a method of manufacturing the same.

Another object of the present invention is to provide a semiconductor device having an IIL circuit which can suppress the parasitic bipolar operation, suppress a junction capacitance between a base region and an emitter region, and can be reduced in size, and a method of manufacturing the same.

The semiconductor device according to the present invention includes, in one aspect, a semiconductor substrate of a first conductivity type having the main surface, a semiconductor layer (first conductive layer), an element isolation insulating layer, a pair of base regions (second conductive layers) of the first conductivity type, an impurity region of a second conductivity type, and a collector region (third conductive layer) of the second conductivity type. The semiconductor layer is formed on the main surface of the semiconductor substrate, including impurity of the second conductivity type of a first concentration. The element isolation insulating layer is selectively formed in the surface of the semiconductor layer. The pair of base regions are formed in the surface of the semiconductor layer so as to sandwich the element isolation insulating layer. The impurity region is formed in the semiconductor layer directly under the element isolation insulating layer adjacent to the lower surface thereof. The impurity region includes impurity of the second conductivity type of a second concentration higher than the first concentration. The collector region is formed in the base region.

According to the above semiconductor device of the present invention, the impurity region is formed directly under the element isolation insulating layer. The concentration of impurity of the second conductivity type included in the impurity region is higher than the concentration of impurity of the second conductivity type included in the semiconductor layer. Even in the case where the width between base regions is reduced, it is possible to effectively suppress the parasitic bipolar operation between the pair of base regions. It is possible to reduce the isolation width between base regions, that is, the width of the element isolation insulating layer. As a result, it is possible to reduce the device in size compared to the conventional example.

In the case where the impurity region is formed directly under the element isolation insulating layer as described above, however, concern is the increase of the junction capacitance between the base region and the semiconductor layer. However, since the above-described impurity region is formed under the element isolation insulating layer, the impurity region is to be formed at a position deeper than that of the base region in the semiconductor layer. As a result, the concentration of the semiconductor layer in the vicinity of the base region does not become high, except only a part of the region where the impurity region is adjacent to the base region. It is possible to substantially suppress the junction capacitance compared to the conventional example shown in FIG. 21. The junction capacitance will not be problematic from the standpoint of performance.

The semiconductor device according to the present invention includes, in another aspect, a semiconductor substrate of a first conductivity type having the main surface, a semiconductor layer of a second conductivity type, first and second base regions of the first conductivity type, an element isolation insulating layer, an impurity region of the second conductivity type, and a collector region of the second conductivity type. The semiconductor layer is formed on the main surface of the semiconductor substrate, including an impurity of the second conductivity type of a first concentration. The first and second base regions are spaced from each other at a predetermined region in the surface of the semiconductor layer. The element isolation insulating layer is selectively formed in the surface of the semiconductor layer so as to isolate the first and second base regions from each other and to surround each of the base regions. The impurity region is formed in the semiconductor layer directly under the element isolation insulating layer. An impurity region includes impurity of the second conductivity type of a second concentration higher than the first concentration. The impurity region is formed so as to surround the first and second base regions. The collector region is formed in the surface of the first and second base regions.

According to the semiconductor device of the present invention, the impurity region is formed so as to surround the first and second base regions. Similar to the above case, it is possible to effectively suppress the parasitic bipolar operation between the first and second base regions. As a result, similar to the case of the above-described one aspect, it is possible to reduce a semiconductor device having an IIL circuit in size.

According to a method of manufacturing a semiconductor device of the present invention, in one aspect, a semiconductor layer of a second conductivity type is first formed on the main surface of a semiconductor substrate of a first conductivity type. A mask layer of a predetermined shape is formed on the semiconductor layer. With the mask layer used as a mask, an impurity of the second conductivity type is introduced into the surface of the semiconductor layer. With a part of the above-described mask layer used as a mask, an element isolation insulating layer is formed in the surface of the semiconductor layer, and an impurity region of the second conductivity type is formed in the semiconductor layer directly under the element isolation insulating layer, by applying thermal treatment to the surface of the semiconductor layer. Then, the above-described mask layer is removed. It should be noted that a mask pattern of the mask layer for implantation of impurity of the second conductivity type is the same as that for formation of the element isolation insulating layer. By introducing impurity of the first conductivity type into a predetermined region in the surface of the semiconductor layer with the element isolation insulating layer used as a mask, a base region of the first conductivity type is formed. By selectively introducing an impurity of the second conductivity type into the surface of the base region, a collector region of the second conductivity type is formed in the surface of the base region.

According to the method of manufacturing a semiconductor device of the present invention, the semiconductor layer is subjected to thermal treatment with an impurity of the second conductivity type introduced in advance into a predetermined region in the surface thereof. As a result, it is possible to form the element isolation insulating layer, and the impurity region of the second conductivity type under the element isolation insulating layer.

At the interface between the element isolation insulating layer and the semiconductor layer, a concentration peak of impurity of the second conductivity type included in the above-described impurity region is formed in the semiconductor layer positioned in the vicinity of the lower surface of the element isolation insulating layer because of the segregation effect of the impurity conventionally known. As a result, it is possible to effectively suppress the parasitic bipolar operation between the base regions. In other words, a semiconductor device having an IIL circuit can be obtained in which the parasitic bipolar operation between base regions is effectively suppressed.

The pattern shape of the mask layer for impurity implantation for forming an impurity region can be the same as the pattern shape of the mask layer for forming an element isolation insulating layer. As a result, it is not necessary to form a new mask layer in formation of a new impurity region.

According to a method of manufacturing a semiconductor device of the present invention, in another aspect, a semiconductor layer of a second conductivity type is formed on the main surface of a semiconductor substrate of a first conductivity type. A first mask layer patterned into a predetermined shape is formed on the surface of the semiconductor layer. With the first mask layer used as a mask, an impurity of the second conductivity type is introduced into the surface of the semiconductor layer. Then, the first mask layer is removed. A second mask layer patterned into a predetermined shape is formed on the surface of the semiconductor layer. By applying thermal treatment to the semiconductor layer with the second mask layer used as a mask, an element isolation insulating layer is selectively formed in the surface of the semiconductor layer. At the same time, an impurity region of the second conductivity type is formed in a region in the semiconductor layer positioned directly under the element isolation insulating layer. Then, the second mask layer is removed. By introducing an impurity of the first conductivity type into a predetermined region in the surface of the semiconductor layer with the element isolation insulating layer used as a mask, a base region of the first conductivity type is formed. By selectively introducing an impurity of the second conductivity type into the surface of the base region, a collector region of the second conductivity type is formed in the surface of the base region.

According to the method of manufacturing a semiconductor device of the present invention, in the another aspect, since the first and second mask layers are formed, the manufacturing cost is increased compared to the case of the above-described one aspect. However, by implanting an impurity of the second conductivity type for forming the impurity region, it is possible to introduce the impurity of the second conductivity type also into a region other than the impurity formation region. It is possible to simultaneously introduce the impurity of the second conductivity type under a region where an emitter electrode is formed in the surface of the semiconductor layer serving as the emitter region. As a result, it is possible to reduce electrical resistance in the region, making it possible to obtain a semiconductor device having an IIL circuit of high performance.

If the opening width of the pattern of the first mask layer is shorter than that of the second mask layer, when the element isolation insulating layer and the impurity region are formed, it is possible to form the impurity region at a predetermined interval from the base region. Compared to the case where an end portion of the base region and an end portion of the impurity region are in contact with each other, it is possible to lower the concentration of the impurity of the second conductivity type included in the semiconductor layer positioned between the base region and the impurity region. As a result, it is possible to improve the breakdown voltage of the junction portion of the base region and the semiconductor layer between the base region and the impurity region, making it possible to obtain a semiconductor device having an IIL circuit of high reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to FIGS. 1 to 19.

(First Embodiment)

Figure 1:
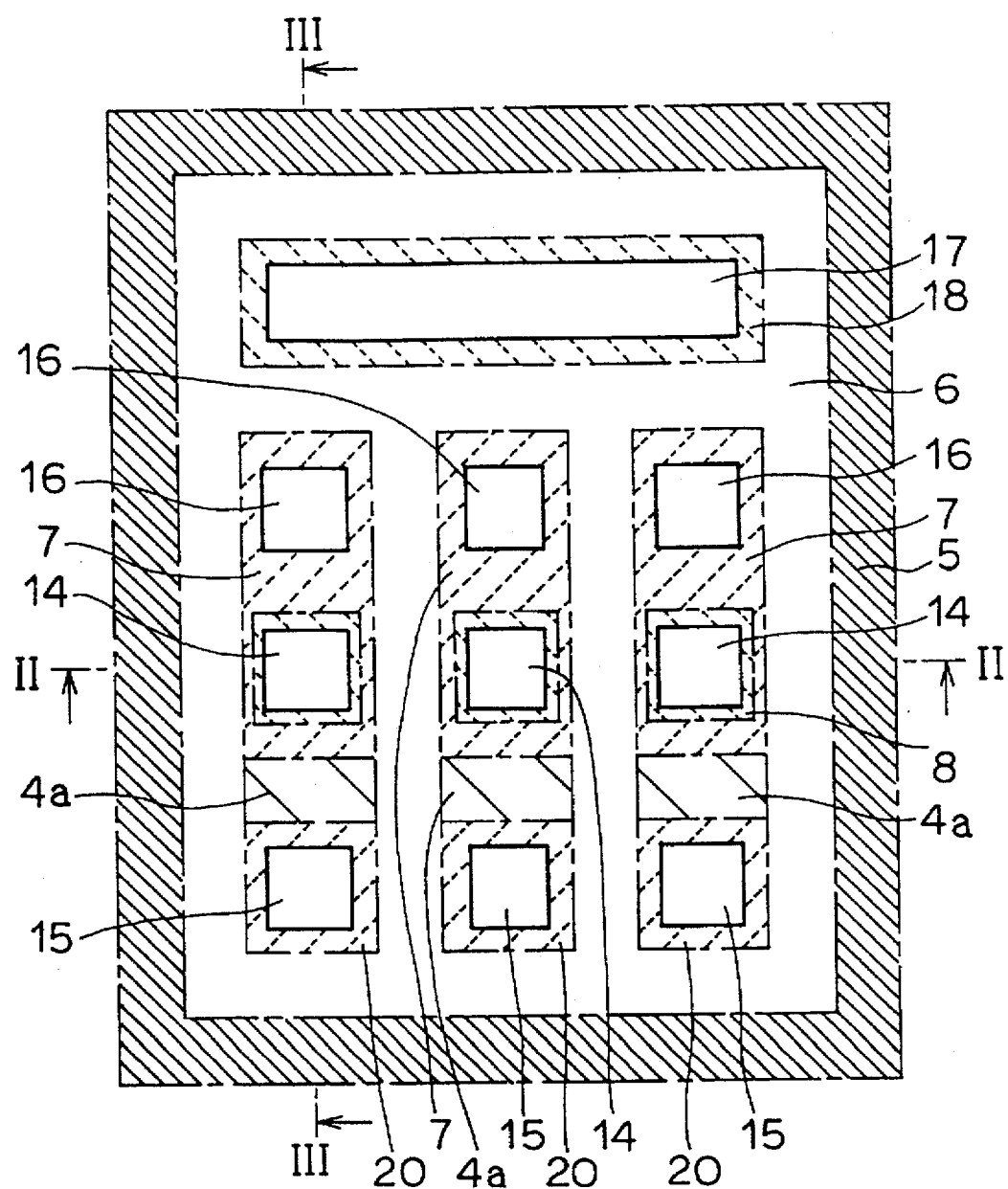
FIG. 1 is a plan view of a semiconductor device having an IIL circuit according to a first embodiment of the present invention.
Figure 2:
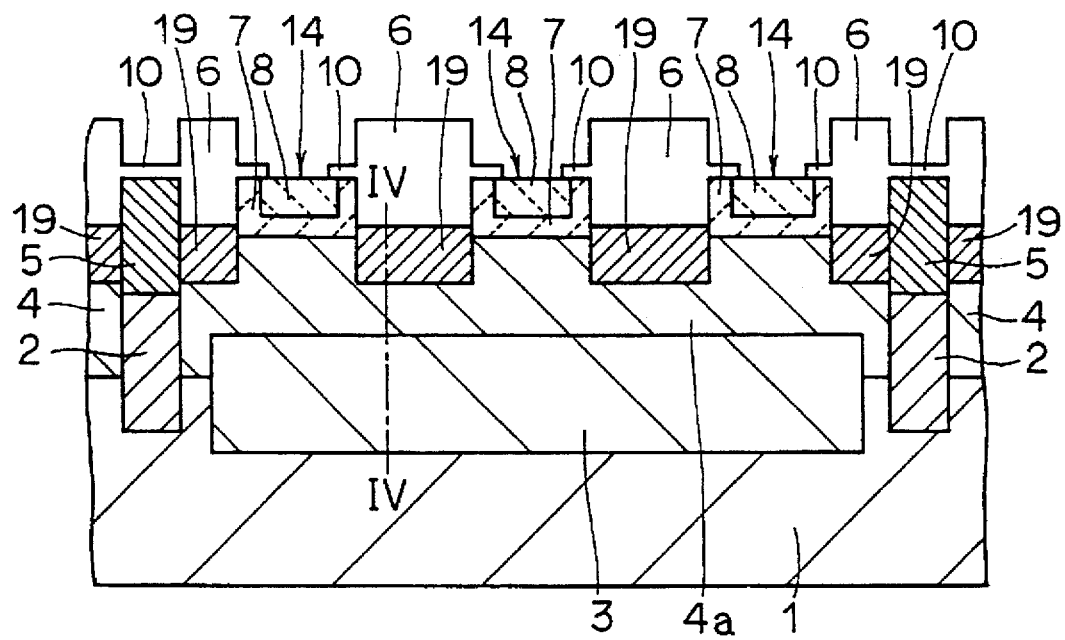
FIG. 2 is a cross sectional view taken along the line II—II in FIG. 1.
Figure 3:
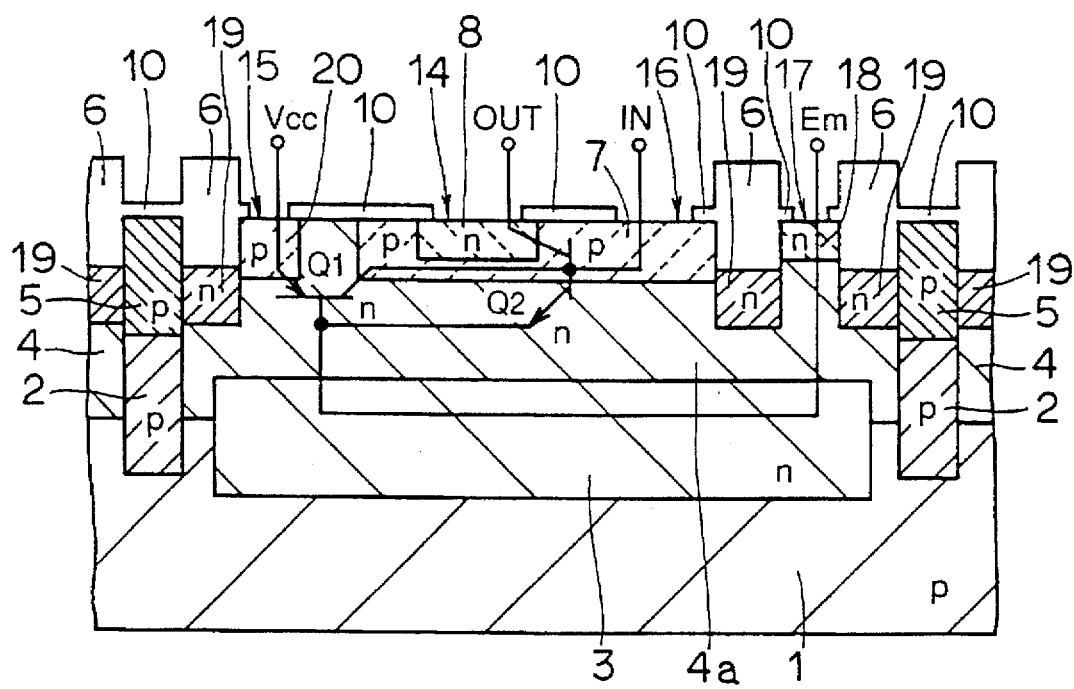
FIG. 3 is a cross sectional view taken along the line III—III in FIG. 1

Referring to FIGS. 1 to 9, a semiconductor device having an IIL circuit according to the first embodiment of the present invention and a method of manufacturing the same will first be described. FIG. 1 is a plan view of a semiconductor device having an IIL circuit according to the first embodiment of the present invention. FIG. 2 is a cross sectional view taken along the line II—II in FIG. 1. FIG. 3 is a cross sectional view taken along the line III—III in FIG. 1.

Description will first be given of a plan structure of the semiconductor device having an IIL circuit according to the first embodiment with reference to FIG. 1. Referring to FIG. 1, p type isolation region 5 is formed annually so as to surround one element forming region. Three columns of base region 7 are formed in a region surrounded by p type isolation region 5 so as to extend in a predetermined direction. A base electrode forming region 16 is formed in a predetermined region in the surface of base region 7.

An n type collector region 8 is formed at a predetermined position in the surface of base region 7. A collector electrode forming region 14 is formed in a predetermined region in the surface of collector region 8.

n type epitaxial layer 4a is posed between base region 7 and p type diffusion region 20. An injector electrode forming region 15 is formed in a predetermined region in the surface of p type diffusion region 20.

An $n^+$ type diffusion region 18 is formed at a predetermined interval to base region 7. An emitter electrode forming region 17 is formed in a predetermined region in the surface of $n^+$ type diffusion region 18. Field oxide film 6 is selectively formed so as to surround base region 7, p type diffusion region 20, n type epitaxial layer 4a sandwiched by p type diffusion region 20 and base region 7, and $n^+$ type diffusion region 18.

Figure 21:
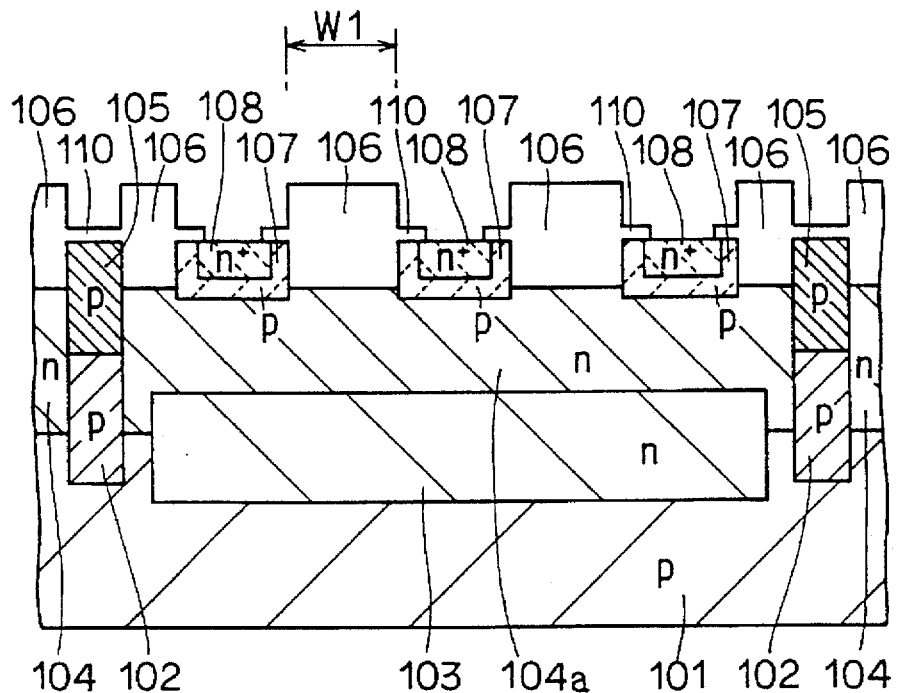
FIG. 21 is a partial cross sectional view of a semiconductor device having the conventional IIL circuit.

Referring to FIGS. 2 and 3, description will now be given of a cross sectional structure of the above-described semiconductor device having an IIL circuit. Referring to FIG. 2, the difference between the structure of the semiconductor device having an IIL circuit according to this embodiment and the structure of a conventional example shown in FIG. 21 is that n type diffusion region 19 is formed in n type epitaxial layer 4a positioned under field oxide film 6. The concentration of n type impurity included in n type diffusion region 19 is higher than that of n type impurity included in n type epitaxial layer 4a.

As described above, by including n type diffusion region 19 of a relatively high concentration, it is possible to effectively suppress the parasitic bipolar operation (parasitic pnp operation) between base regions 7. Accordingly, it is possible to decrease the interval between base regions 7 compared to the conventional example shown in FIG. 21. As a result, it is possible to suppress the parasitic bipolar operation and to reduce the semiconductor device having an IIL circuit in size.

The structure other than the above is similar to the case of the conventional example shown in FIG. 21. More specifically, n type epitaxial layers 4, 4a are formed on the main surface of p type semiconductor substrate 1. n type buried layer 3 and p type buried isolation region 2 are formed in n type epitaxial layers 4, 4a and p type semiconductor substrate 1.

p type isolation region 5 is formed on p type buried isolation region 2. Field oxide film 6 of a thickness of approximately 1.5 μm and p type base region 7 are formed at predetermined positions in the surface of n type epitaxial layers 4, 4a. n type collector region 8 is formed in the surface of p type base region 7.

Referring to FIG. 3, another cross sectional structure of the semiconductor device having an IIL circuit shown in FIG. 1 will be described. Referring to FIG. 3, p type diffusion region 20 is formed at a predetermined interval to base region 7. Lateral pnp transistor Q1 is formed of p type diffusion region 20, base region 7 and that portion of n type epitaxial layer 4a sandwiched by the p type diffusion region 20 and base region 7.

Vertical npn transistor Q2 is formed of n type epitaxial layer (emitter region) 4a, base region 7, and collector region 8. $n^+$ type diffusion region 18 is formed in a predetermined region in the surface of n type epitaxial layer 4a. Emitter electrode forming region 17 is formed on $n^+$ type diffusion region 18.

In the above-described structure, the concentration of n type impurity included in collector region 8 is approximately $10^{20}$ cm$^{-3}$. The concentration of n type impurity included in n type epitaxial layers 4, 4a is approximately $10^{15}$–$10^{16}$ cm$^{-3}$. The concentration of n type impurity included in n type diffusion region 19 is preferably more than $10^{16}$ cm$^{-3}$ and approximately $10^{17}$ cm$^{-3}$ or less. As described above, by making the concentration of n type diffusion region 19 greater than that of n type epitaxial layer 4a, it is possible to suppress the parasitic bipolar operation between base regions 7.

By setting the concentration of n type impurity included in n type impurity region 19 to approximately $10^{17}$ cm$^{-3}$ or less, the breakdown voltage at the contact portion of n type diffusion region 19 and base region 7 can be ensured to some extent. As a result, a certain reliability can be obtained. It should be noted that the concentration of p type impurity included in base region 7 is approximately $10^{18}$ cm$^{-3}$.

Figure 4:
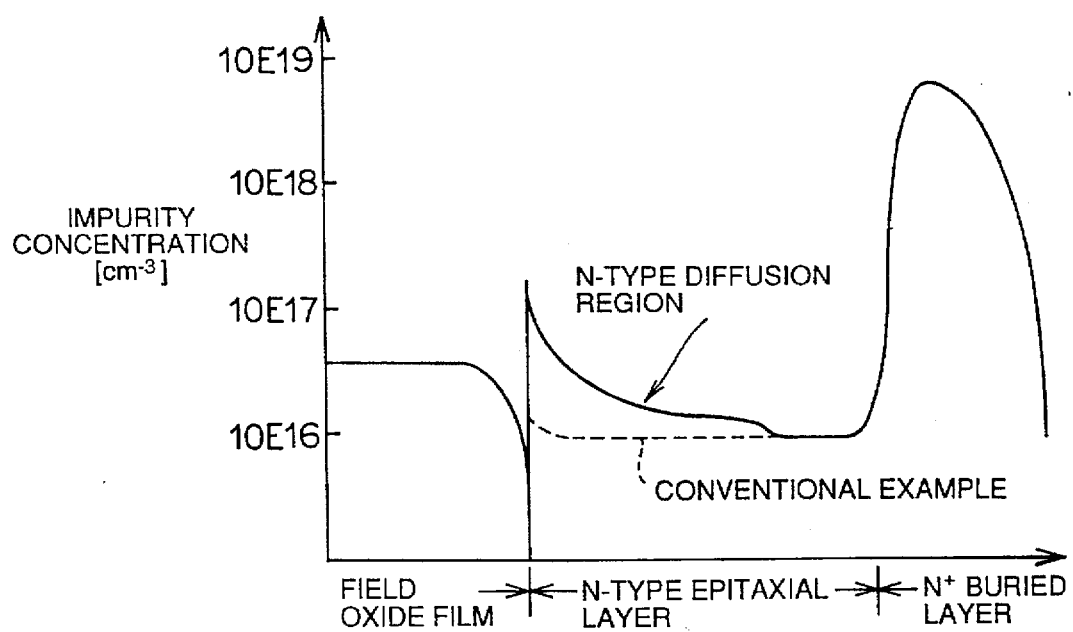
FIG. 4 is a diagram showing concentration distribution of impurity along the line IV—IV in FIG. 2.

Referring to FIG. 4, description will now be given in more detail of the concentration distribution of n type impurity under field oxide film 6. FIG. 4 is a diagram showing concentration distribution of n type impurity under field oxide film 6. It should be noted that the concentration distribution of impurity in a cross section along the line IV—IV in FIG. 2 is shown in FIG. 4.

Referring to FIG. 4, by including n type diffusion region 19, it is understood that the concentration of n type impurity included in n type epitaxial layer 4a directly under field oxide film 6 becomes higher than the case of the conventional example. In particular, in the direction of depth of n type epitaxial layer 4a, it is understood that a concentration peak of impurity included in n type diffusion region 19 is positioned in the vicinity of the lower surface of field oxide film 6.

As described above, by the concentration peak of n type impurity included in n type diffusion region 19 positioned directly under field oxide film 6 in the vicinity of the lower surface thereof, it is possible to suppress the parasitic bipolar operation between base regions 7 more effectively and reliably. Since the concentration distribution of n type impurity as shown in FIG. 4 is due to a method of manufacturing the semiconductor device, the concentration distribution will be described in more detail when a method of manufacturing the semiconductor device is described later.

Figure 5:
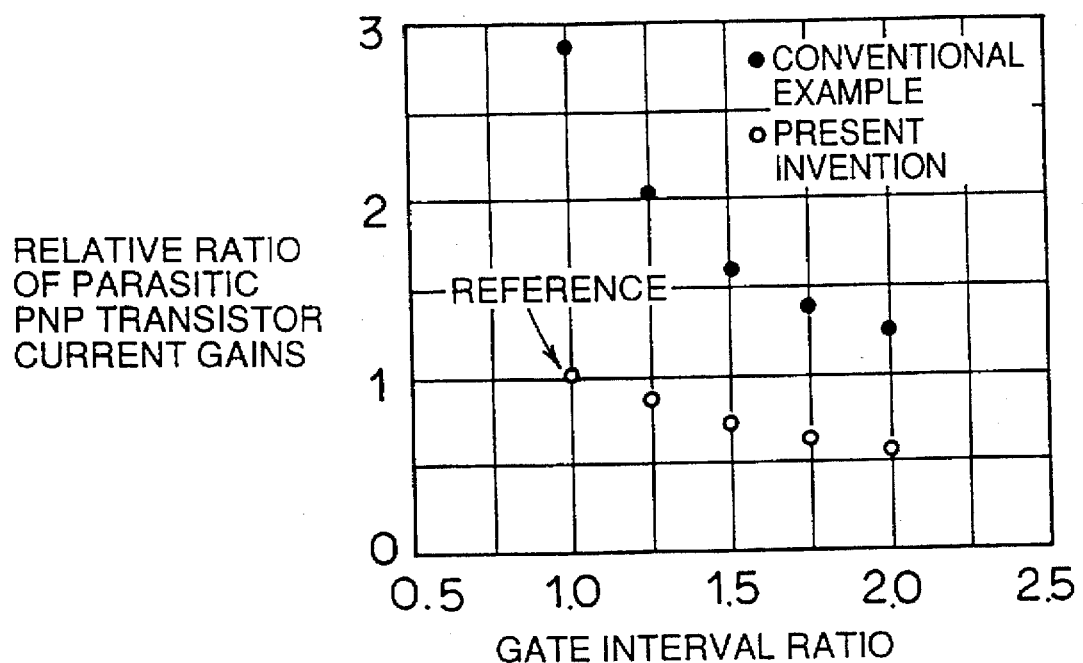
FIG. 5 is a diagram showing the relationship between a gate interval ratio and a relative ratio of parasitic pnp transistor current gains.

Referring to FIG. 5, the effect of suppressing the parasitic bipolar operation according to this embodiment will be described. It should be noted that the similar effect can be obtained in the second and third embodiments to be described later. FIG. 5 is a graph showing the relationship between the gate interval ratio and the relative ratio of parasitic pnp transistor current gains.

It should be noted that the gate interval ratio here is a value represented by (interval between base regions 7)/(interval between predetermined base regions 7 serving as a reference). The relative ratio of the parasitic pnp transistor current gains is a value represented by (the parasitic pnp transistor current gains between base regions 7)/(the parasitic pnp transistor current gains between predetermined base regions 7 serving as a reference).

As shown in FIG. 5, it is understood that the parasitic pnp transistor effect between base regions 7 is more suppressed in the present invention than in the conventional example. It is also understood that the reduction effect increases as the interval between base regions 7 becomes smaller. More specifically, even if the semiconductor device is reduced in size, it is possible to obtain a semiconductor device having an IIL circuit in which the parasitic pnp transistor effect (parasitic bipolar operation) is effectively suppressed.

Referring to FIGS. 6 to 9, description will now be given of a method of manufacturing a semiconductor device having an IIL circuit according to the above-described first embodiment. FIGS. 6 to 9 are cross sectional views showing the first to the fourth steps of the manufacturing process of a semiconductor device having an IIL circuit according to the first embodiment of the present invention.

Figure 6:
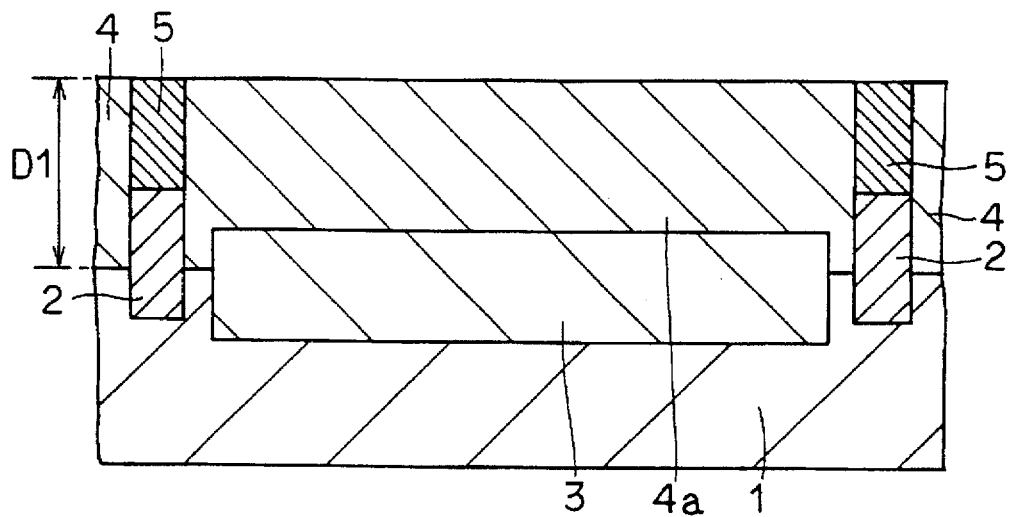
FIGS. 6 to 9 are cross sectional views showing the first through fourth steps of the manufacturing process of a semiconductor device having an IIL circuit according to the first embodiment of the present invention.

Referring to FIG. 6, by steps similar to those of the conventional example, n type buried layer 3, p type buried isolation region 2, p type isolation region 5, and n type epitaxial layers 4, 4a are respectively formed on the main surface of p type semiconductor substrate 1. The thickness D1 of n type epitaxial layers 4, 4a is approximately 3.5–4 μm.

Figure 7:
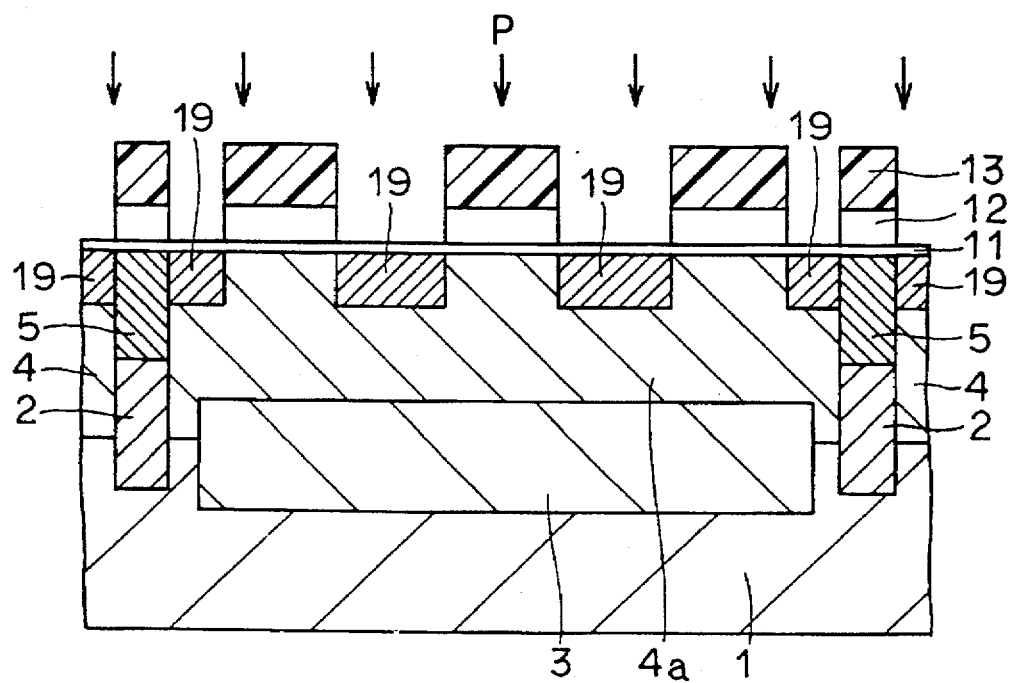

Referring to FIG. 7, with a CVD method, a thermal oxidation method or the like, a silicon oxide film (SiO$_2$) 11 is deposited approximately 500 Å on n type epitaxial layers 4a, 4. With a CVD method or the like, a silicon nitride film (Si$_3$N$_4$) having a thickness of approximately 1000 Å is formed on silicon oxide film 11.

A resist pattern 13 patterned into a predetermined shape is formed on silicon nitride film 12. With resist pattern 13 used as a mask, silicon nitride film 12 are patterned into a predetermined shape. With resist pattern 13, silicon nitride film 12, and silicon oxide film 11 used as a mask, n type impurity such as phosphorus (P) is implanted into the surface of n type epitaxial layer 4a. The implantation condition is approximately 120 keV and $1 \times 10^{13}$ cm$^{-2}$. Resist pattern 13 is then removed.

Figure 8:
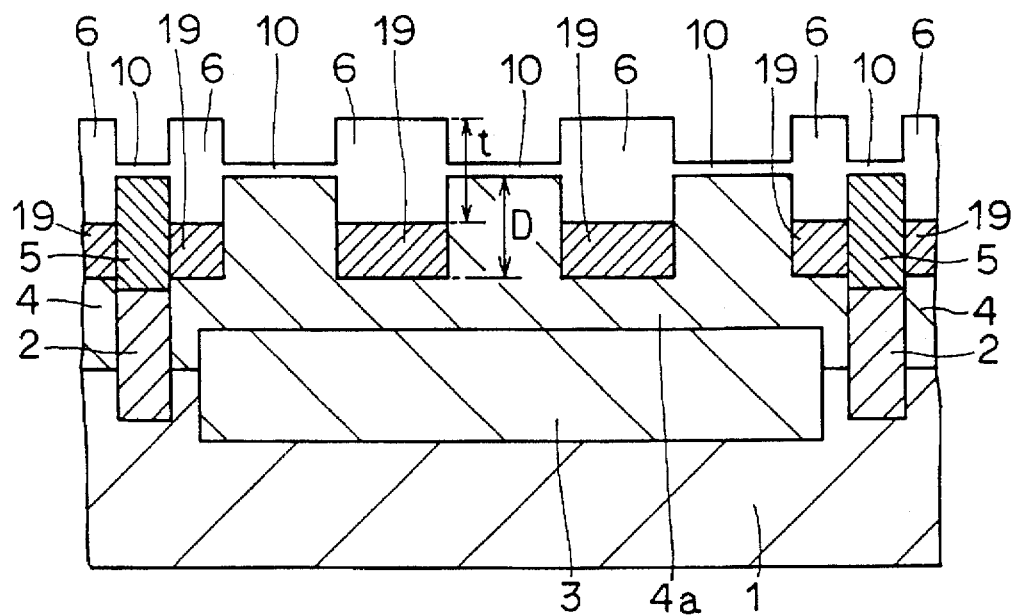

Referring to FIG. 8, with the above-described silicon oxide film 11 and silicon nitride film 12 used as a mask, thermal treatment (LOCOS method) is applied at a high temperature (900° C.–1000° C.) for a long time from several hours to several ten hours. This condition depends on the thickness of field oxide film 6. With the treatment, field oxide film 6 is selectively formed, and n type diffusion region 19 is formed under field oxide film 6. At this time, the thickness t of field oxide film 6 is preferably approximately 1.5 μm. n type diffusion region 19 has a diffusion depth D of approximately 1.5–3.0 μm. Furthermore, by introducing n type impurity into n type epitaxial layer 4a under the implantation condition as described above, the concentration of n type impurity included in n type diffusion region 19 is approximately $10^{17}$ cm$^{-3}$ or less.

As described above, by forming field oxide film 6 after introducing n type impurity in advance into the surface of n type epitaxial layer 4a, n type diffusion region 19 having concentration distribution of impurity as shown in FIG. 4 is to be formed.

This is a phenomenon caused by the segregation effect of impurity such as phosphorus (P) on the oxide film. Because of the segregation effect, in the vicinity of the interface between field oxide film 6 and n type epitaxial layer 4a, the concentration of n type impurity included in n type epitaxial layer 4a peaks, as shown in FIG. 4. As a result, it is possible to effectively suppress the parasitic bipolar operation between base regions 7 to be formed by the later step.

Figure 9:
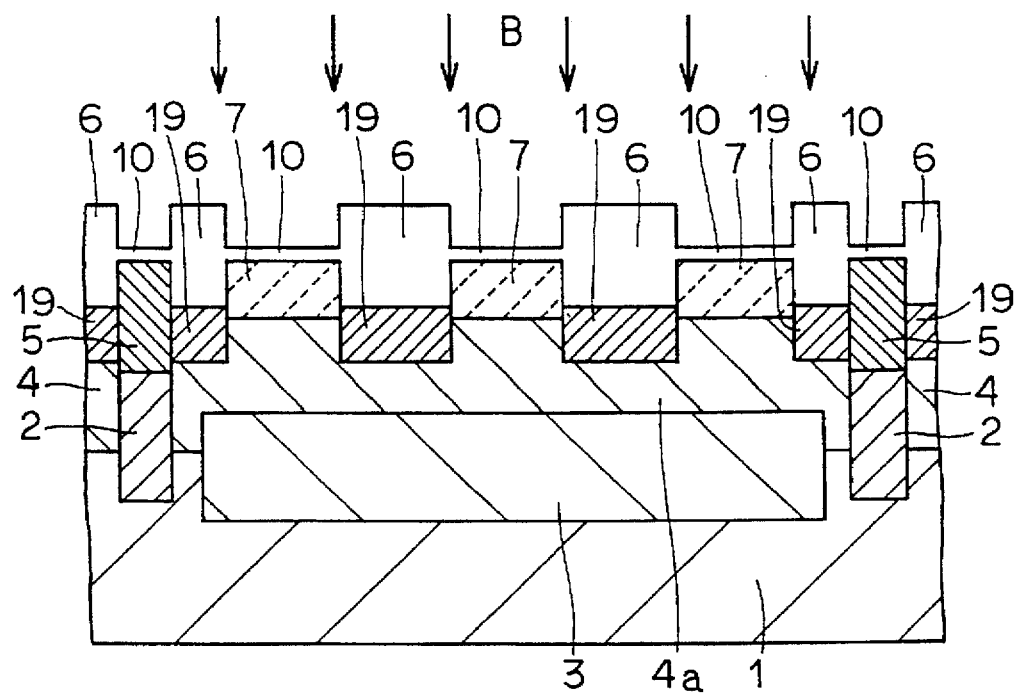

Referring to FIG. 9, with field oxide film 6 used as a mask, p type impurity such as boron (B) is implanted into a predetermined region of the surface of n type epitaxial layer 4a. The implantation condition is approximately 50 keV and $10^{14}$ cm$^{-2}$. As a result, base region 7 is formed. Base region 7 is formed to have a depth of approximately 0.6 μm–0.8 μm.

Figure 22:
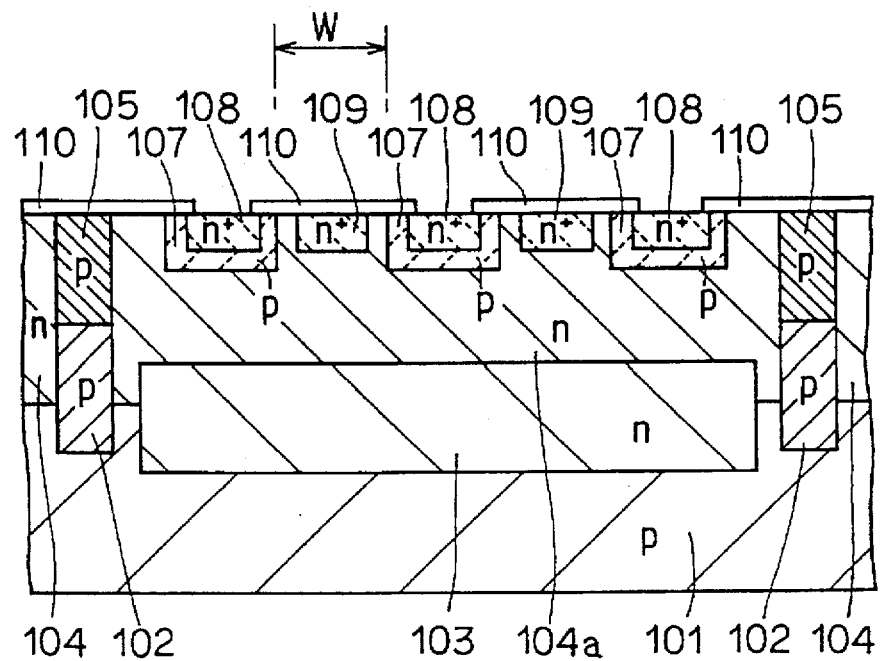
FIG. 22 is a partial cross sectional view showing a semiconductor device having the conventional IIL circuit where an emitter collar region is used for isolation between base regions.
Figure 23:
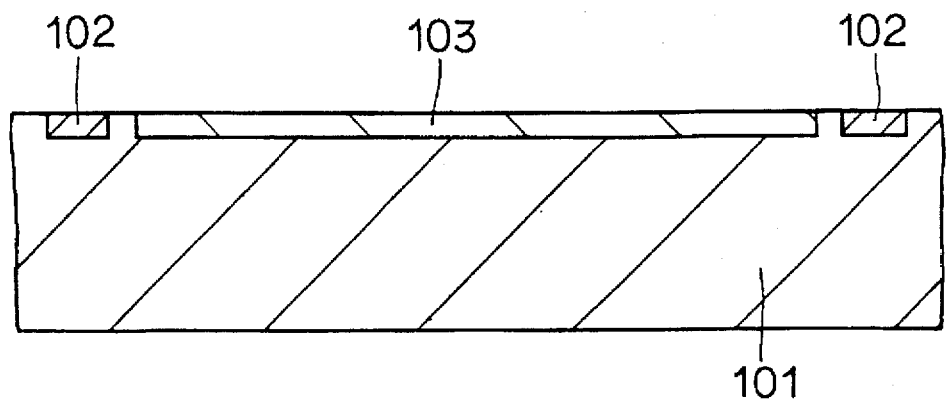
FIGS. 23 to 27 are cross sectional views showing the first to the fifth steps of the manufacturing process of a semiconductor device having an IIL circuit shown in FIG. 21.
Figure 24:
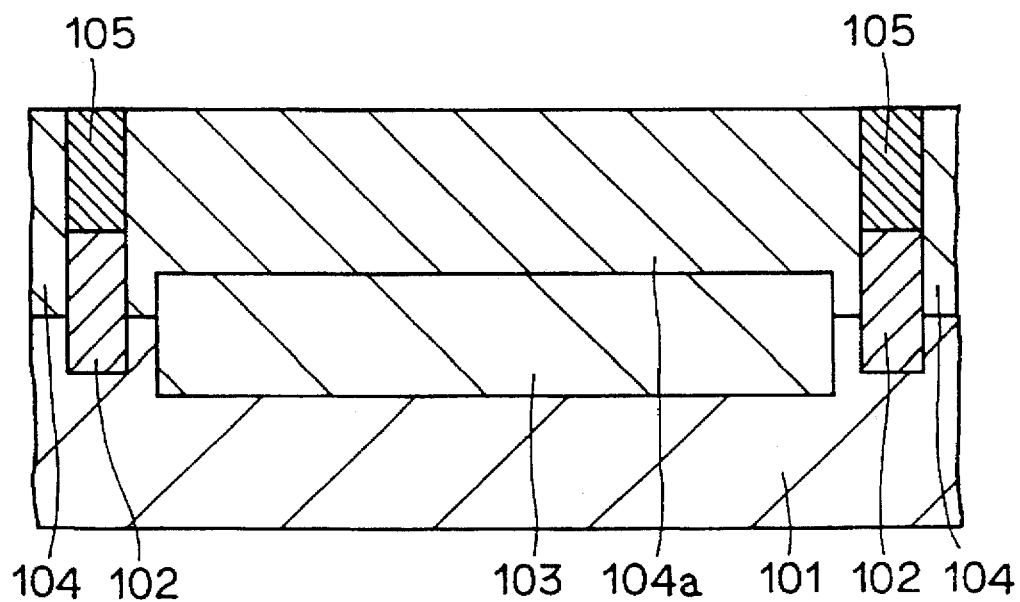
Figure 25:
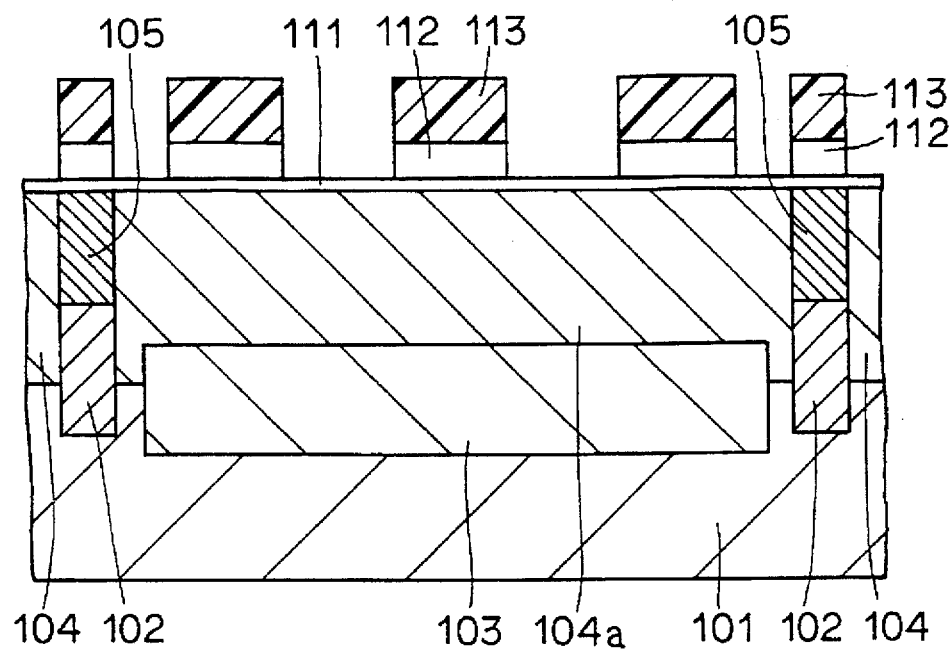
Figure 26:
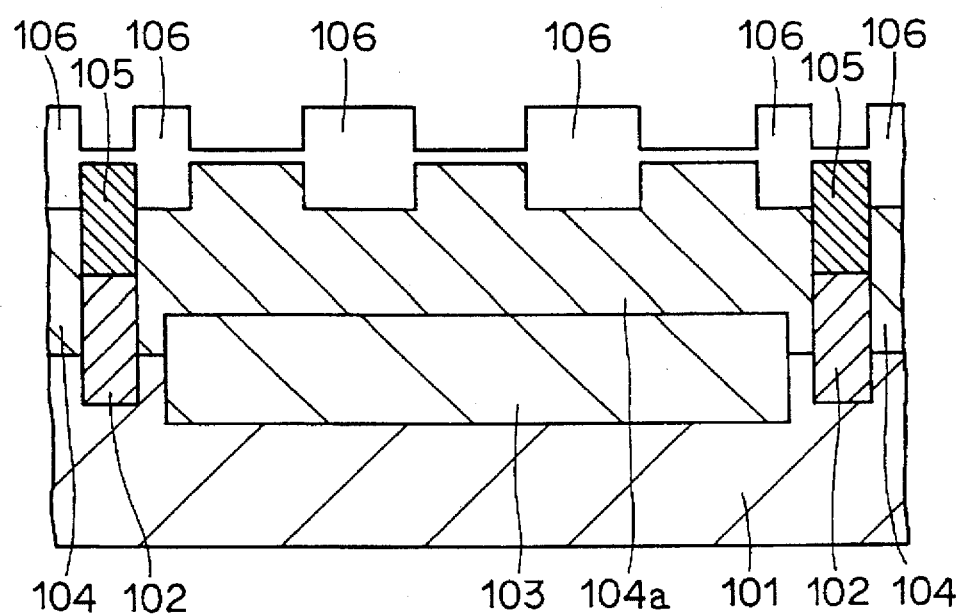
Figure 27:
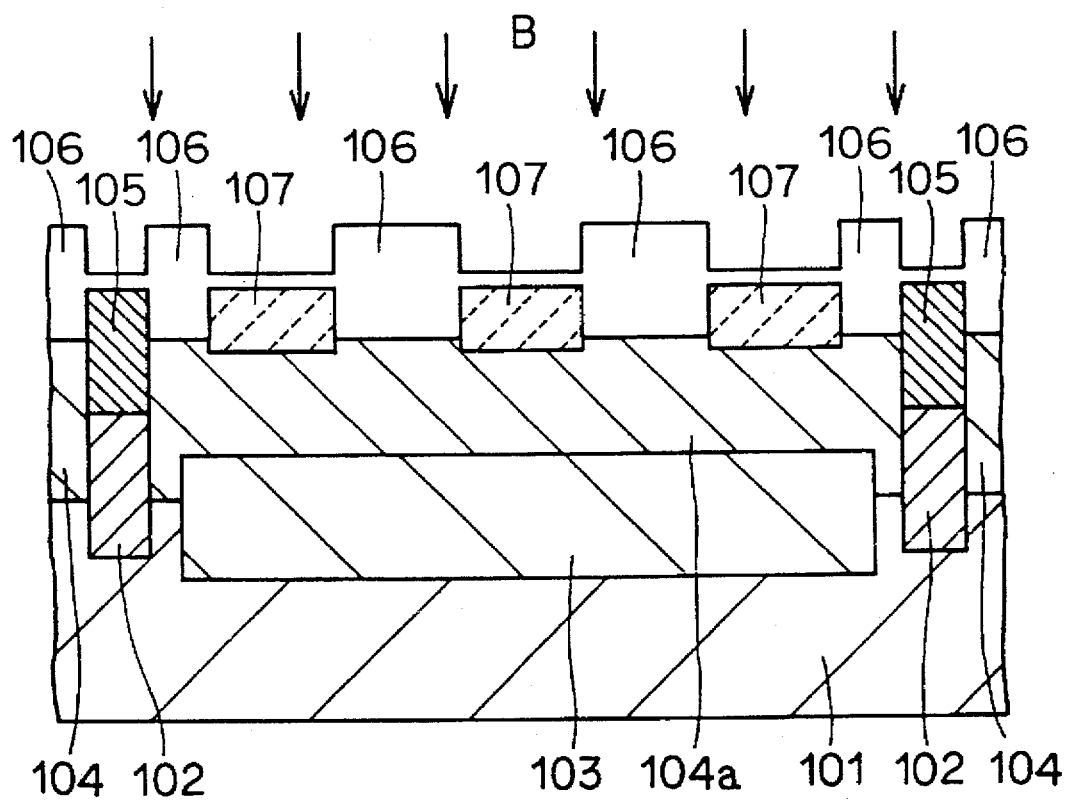

By forming base region 7 as described above, as shown in FIG. 9, a part of base region 7 and a part of n type diffusion region 19 are in contact with each other. As a result, the junction capacitance at a junction portion between of base region 7 and n type epitaxial layer 4a becomes greater than the case shown in FIG. 21. However, since n type diffusion region 19 is formed at a position deeper than that of base region 7 in n type epitaxial layer 4a, the junction area of base region 7 and a region of a high impurity concentration in n type epitaxial layer 4a is substantially decreased compared to the case where the n$^+$ emitter collar shown in FIG. 22 is used. As a result, the junction capacitance can be substantially reduced compared to the case shown in FIG. 22.

The concentration of n type diffusion region 19 is $10^{17}$ cm$^{-3}$, which is lower than the concentration ($10^{19}$–$10^{20}$ cm$^{-3}$) of the n$^+$ emitter collar region. Therefore, the concentration of n type epitaxial layer 4a in the vicinity of base region 7 is not as large as the case shown in FIG. 22. As described above, the junction capacitance between base region 7 and n type epitaxial layer 4a in this embodiment can be made so small that it is negligible from the standpoint of performance of the IIL.

Then, by implanting n type impurity such as arsenic (As) into the surface of base region 7, collector region 8 is formed. The implantation condition is approximately 50 keV and $10^{15}$ cm$^{-2}$. By the above-described steps, a semiconductor device having an IIL circuit shown in FIG. 2 can be obtained.

(Second Embodiment)

Figure 10:
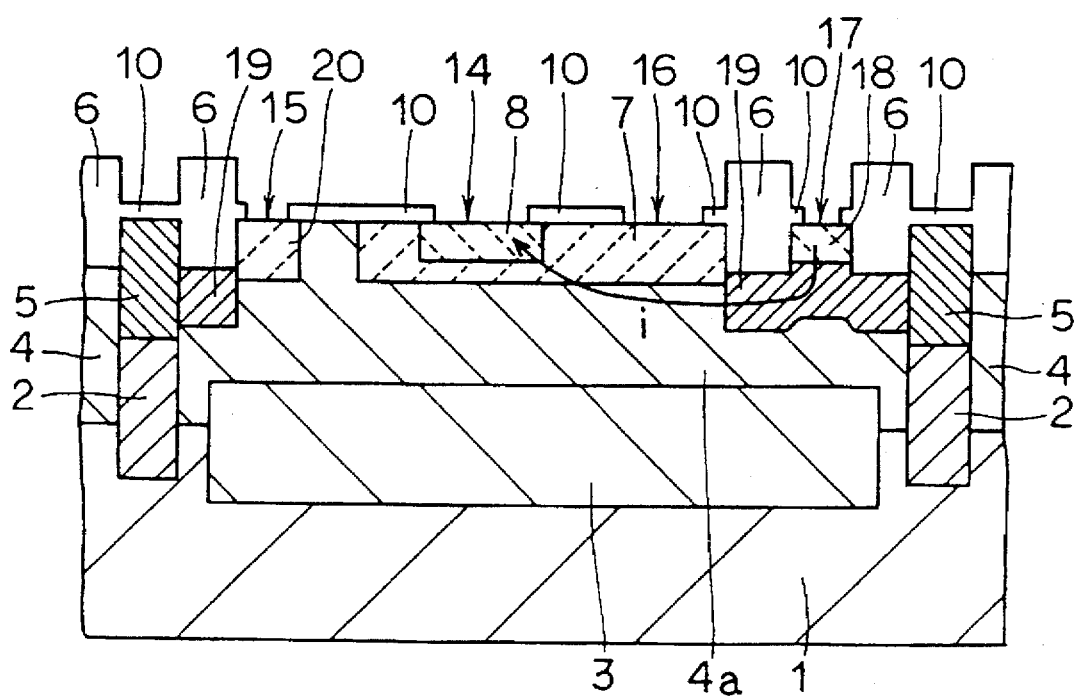
FIG. 10 is a partial cross sectional view of a semiconductor device having an IIL circuit according to a second embodiment of the present invention, showing a cross section corresponding to FIG. 3.

Referring to FIG. 10, description will now be given of the second embodiment of the present invention. FIG. 10 is a partial cross sectional view of a semiconductor device having an IIL circuit according to the second embodiment of the present invention, showing a cross section corresponding to the above-described FIG. 3.

Referring to FIG. 10, the structure of FIG. 10 is different from the cross sectional structure of FIG. 3 in that n type diffusion region 19 is formed extending to n$^+$ type diffusion region 18 thereunder. The structure other than that is similar to the case of the first embodiment shown in FIG. 3.

By extending n type diffusion region 19 under n$^+$ type diffusion region 18 as shown in FIG. 10, it is possible to decrease the resistance of a path of current i flowing in the vertical npn transistor. As a result, it is possible to improve the current gain of the npn transistor.

Description will now be given of a method of manufacturing a semiconductor device having an IIL circuit shown in FIG. 10. In the above-described first embodiment, field oxide film 6 and n type diffusion region were formed using mask layers of a same mask patten. Therefore, n type diffusion region 19 was formed only under field oxide film 6.

In order to obtain a semiconductor device having an IIL circuit of this embodiment, it is necessary to use different mask patterns in implanting n type impurity for forming n type diffusion region 19 and in forming field oxide film 6.

Therefore, it is necessary to form a new mask layer for forming field oxide film 6, which in turn increases the manufacturing cost compared to the above-described first embodiment. However, it is possible to enhance performance of a semiconductor device having an IIL circuit.

Although the case where n type diffusion region 19 is extends to n$^+$ type diffusion region 18 thereunder is shown in FIG. 10, n type diffusion region 19 may extend to other part of a semiconductor device having an IIL circuit.

(Third Embodiment)

Referring to FIGS. 11 to 19, description will be given of the third embodiment of the present invention. This embodiment is an improvement of the above-described first embodiment. A problem concerned in the first embodiment will first be described with reference to FIGS. 11 and 12.

Figure 11:
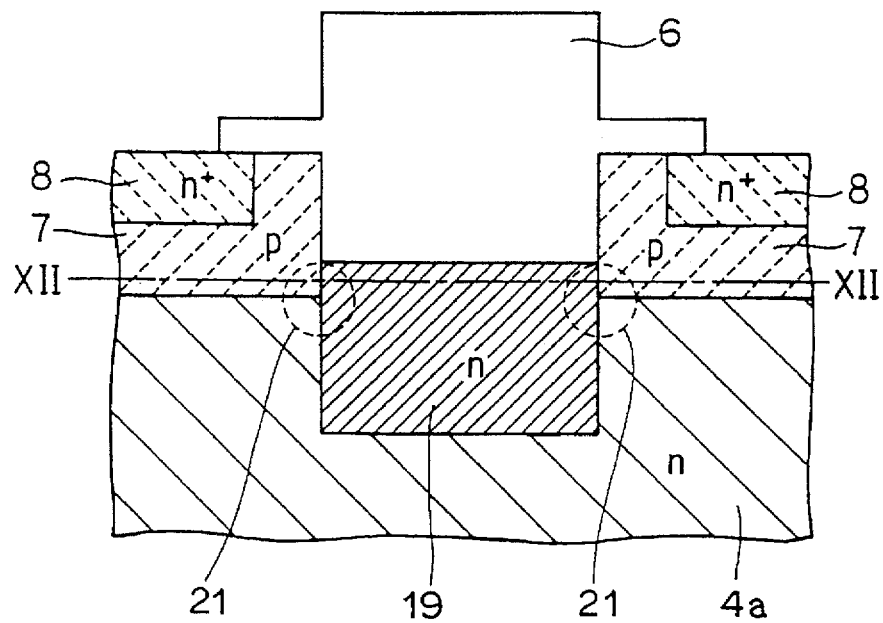
FIG. 11 is a cross sectional view in which the vicinity of an n type diffusion region in FIG. 2 is enlarged.
Figure 12:
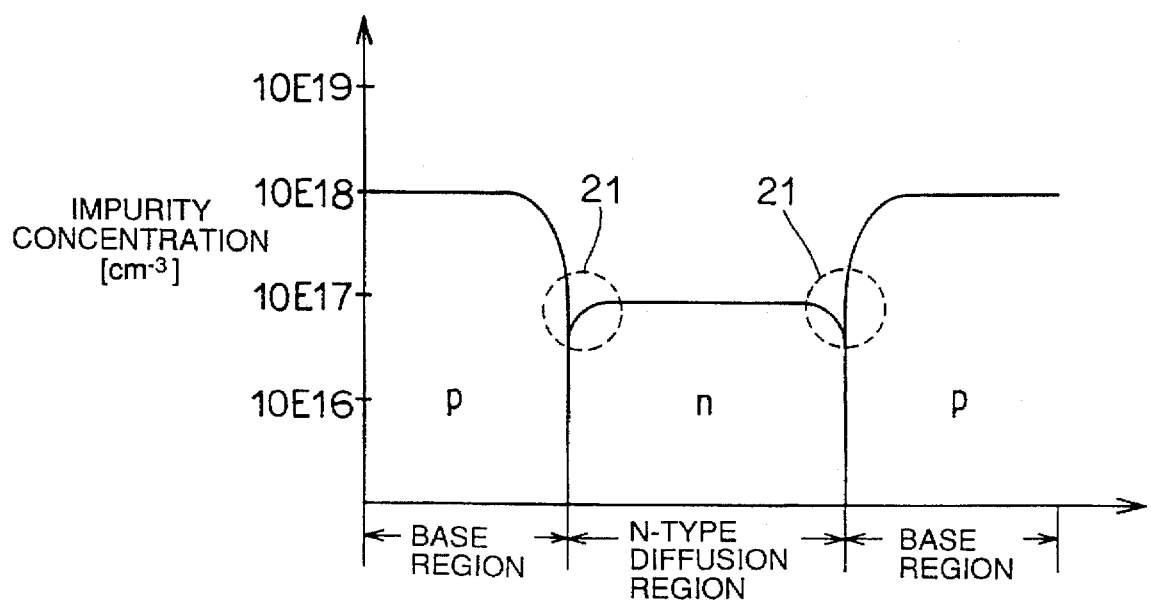
FIG. 12 is a diagram showing concentration distribution of impurity along the line XII—XII in FIG. 11.

FIG. 11 is a cross sectional view in which the vicinity of field oxide film 6 and n$^+$ diffusion region 19 in the first embodiment is enlarged. FIG. 12 is a diagram showing concentration distribution of impurity along the line XII—XII in FIG. 11.

Referring to FIG. 11, a region 21 in which base region 7 and n type diffusion region 19 are in contact with each other is formed in the above-described first embodiment as described above. The concentration gradient at a junction portion of base region 7 and n type diffusion region 19 in this region 21 becomes steep as shown in FIG. 12.

Therefore, there is concern over decrease of the breakdown voltage at the junction portion of base region 7 and n type diffusion region 19. More specifically, concern is that field concentration is likely to occur in the portion, and that leakage current is likely to flow between base region 7 and n type epitaxial layer (emitter region) 4a. This embodiment is for eliminating such a problem.

In the above-described first embodiment, the concentration of n type diffusion region 19 was set relatively low ($10^{17}$ cm$^{-3}$) in view of the problem of the junction breakdown voltage between base region 7 and n type epitaxial layer 4a. Although the junction breakdown voltage was ensured to some extent, it was not sufficient.

Figure 13:
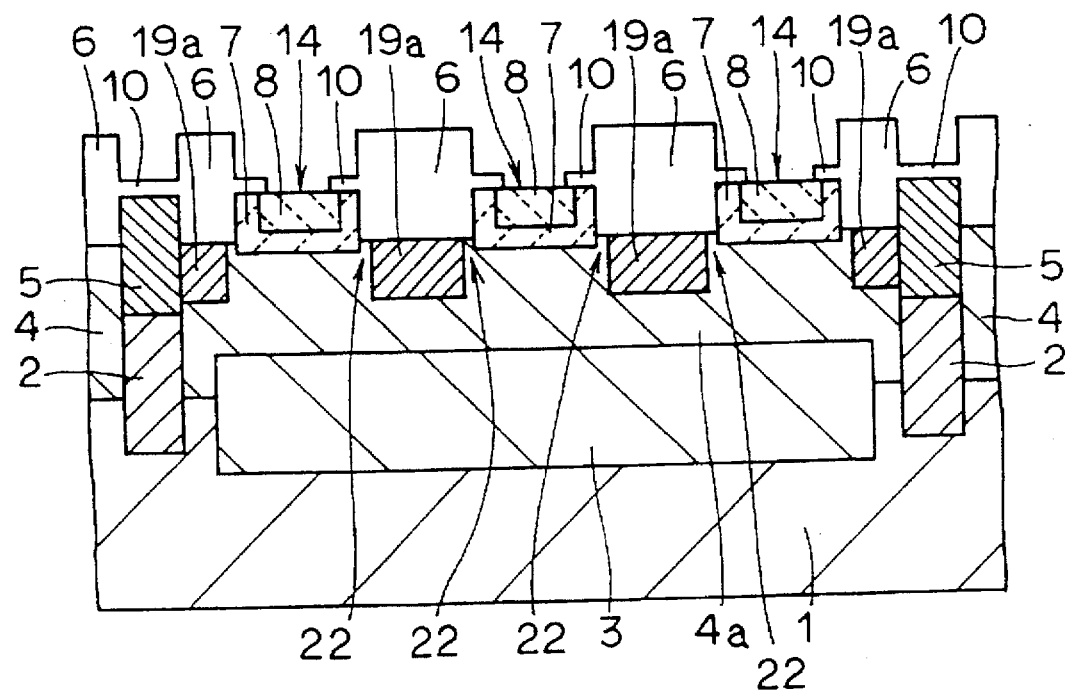
FIG. 13 is a partial cross sectional view of a semiconductor device having an IIL circuit according to a third embodiment of the present invention, showing a cross section corresponding to FIG. 2.

FIG. 13 is a partial cross sectional view of a semiconductor device having an IIL circuit in this embodiment. FIG. 13 shows a cross section corresponding to FIG. 2.

Referring to FIG. 13, the difference between the above-described first embodiment and this embodiment is that base region 7 and n type diffusion region 19a are formed at a predetermined interval to each other. More specifically, a region (offset region) 22 is posed between base region 7 and n type diffusion region 19a. The structure other than that is similar to the case of the first embodiment. Therefore, the similar effect as that of the first embodiment can be obtained.

Figure 14:
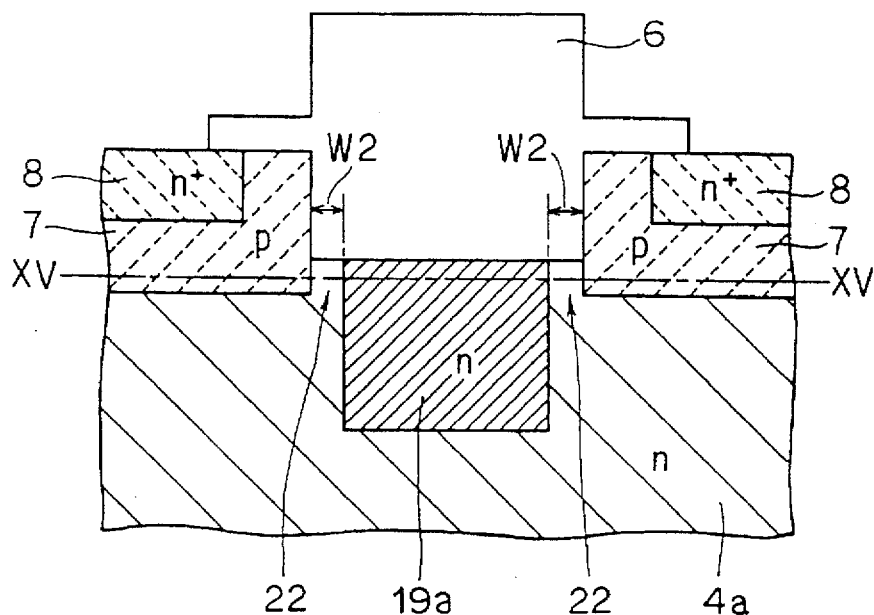
FIG. 14 is a cross sectional view in which the vicinity of an n type diffusion region in FIG. 13 is enlarged.
Figure 15:
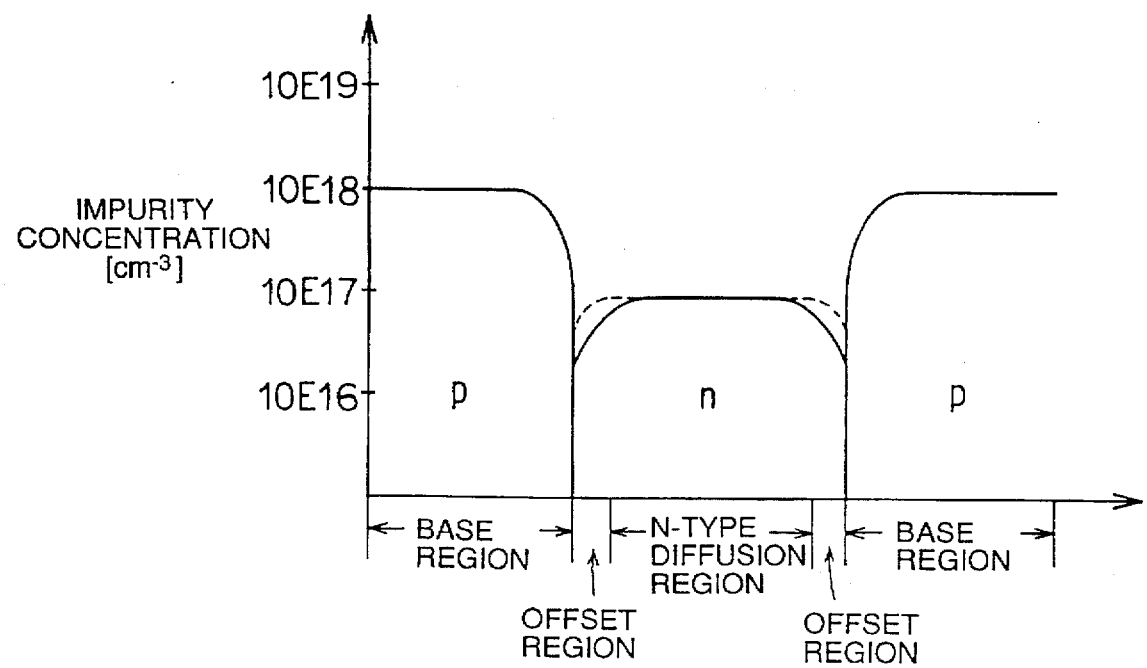
FIG. 15 is a diagram showing concentration distribution of impurity along the line XV—XV in FIG. 14.

As described above, by including region 22, it is possible to enhance the junction breakdown voltage between base region 7 and n type epitaxial layer 4a compared to the case of the first embodiment. The reason will now be described with reference to FIGS. 14 and 15. FIG. 14 is a cross sectional view in which the vicinity of n type diffusion region 19a shown in FIG. 13 is enlarged. FIG. 15 is a diagram of concentration distribution of impurity in a cross section along the line XV—XV shown in FIG. 14.

Referring to FIG. 14, the width W2 of region 22 is preferably approximately 0.5 µm to 1.5 µm. This value is determined by the level of diffusion of n type impurity caused by formation of field oxide film 6. It is preferred that the concentration of region 22 is at least the concentration of n type impurity included in n type epitaxial layer 4a, and lower than that of n type impurity included in n type diffusion region 19a. More specifically, the concentration of n type impurity included in n type diffusion region 19a is preferably $10^{16}$ cm$^{-3}$ or more and less than $10^{17}$ cm$^{-3}$.

Accordingly, as shown in FIG. 15, it is possible to reduce the concentration gradient of n type impurity at the junction portion of n type diffusion region 19a and base region 7 compared to the case of the first embodiment shown in FIG. 12. As a result, it is possible to enhance the junction breakdown voltage between base region 7 and n type epitaxial layer 4a. In FIG. 15, the case of the first embodiment is shown by a dotted line.

Referring to FIGS. 16 to 19, description will be given of a method of manufacturing a semiconductor device having an IIL circuit according to the third embodiment. FIGS. 16 to 19 are enlarged cross sectional views showing the first to the fourth steps of the manufacturing process of a semiconductor device having an IIL circuit of the third embodiment.

Figure 16:
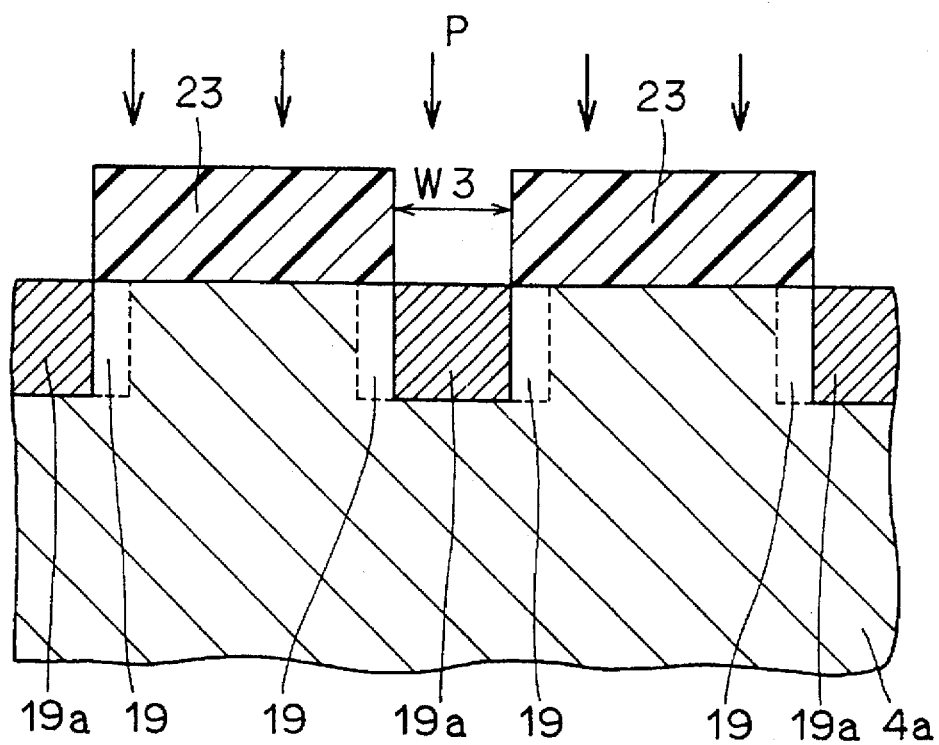
FIGS. 16 to 19 are cross sectional views showing the first to the fourth steps of the manufacturing process of a semiconductor device having an IIL circuit according to the third embodiment of the present invention.

Referring to FIG. 16, by steps similar to those of the first embodiment, a p type isolation region (not shown) is formed. Then, as shown in FIG. 16, a resist pattern 23 patterned into a predetermined shape is formed on the surface of n type epitaxial layer 4a. At this time, the opening width of an opening portion of resist pattern 23 is W3.

With resist pattern 23 used as a mask, n type impurity such as phosphorus (P) is implanted into the surface of n type epitaxial layer 4a. The implantation condition is the same as the case of the first embodiment. Then, resist pattern 23 is removed.

Figure 17:
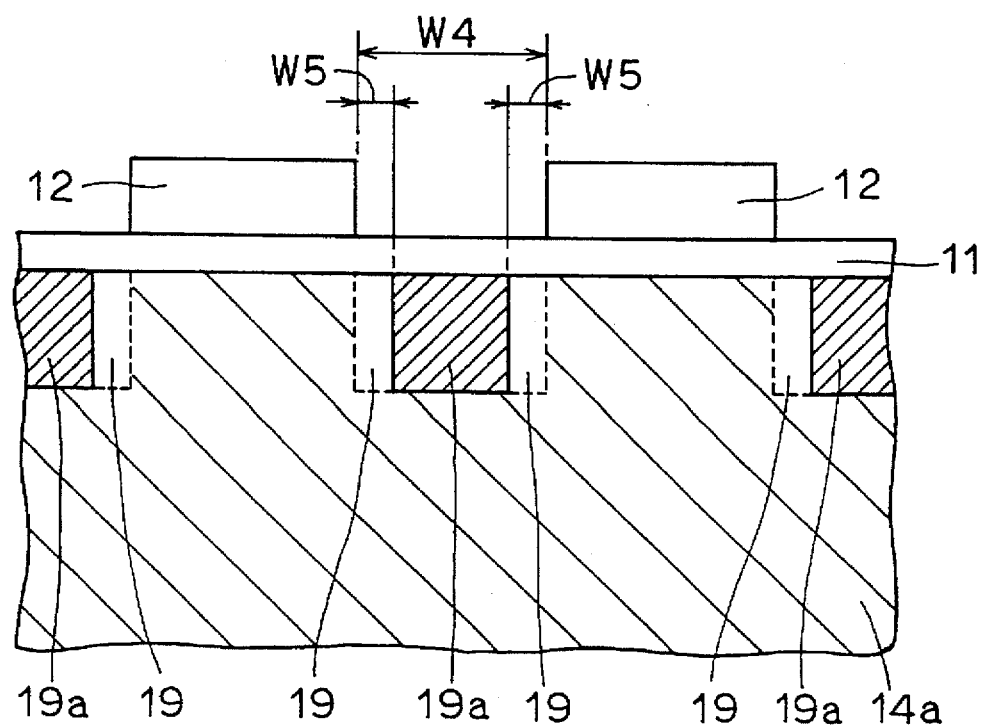

Referring to FIG. 17, by steps similar to those of the first embodiment, silicon oxide film 11 and silicon nitride film 12 are sequentially deposited on the surface of n type epitaxial layer 4a. Silicon nitride film 12 is patterned into a predetermined shape.

At this time, the opening width W4 of an opening portion formed in silicon oxide film 11 and silicon nitride film 12 is made larger than the opening width W3 of resist pattern 23. More specifically, it is preferred that the relation of W4−W3=1−3 µm holds. That is, W5 shown in FIG. 17 is preferably approximately 0.5−1.5 µm.

Figure 18:
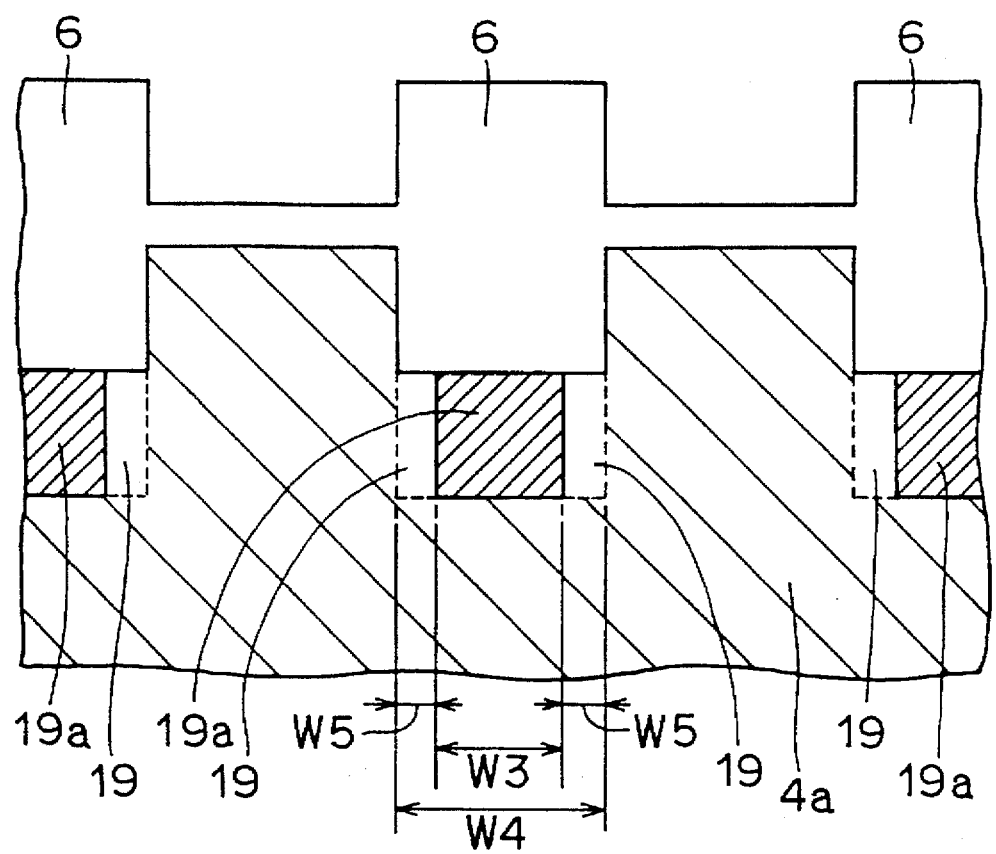

Referring to FIG. 18, similar to the case of the first embodiment, field oxide film 6 of a thickness of approximately 1.5 µm is formed. Field oxide film 6 is formed by thermal treatment (LOCOS method) similar to the case of the above-described first embodiment.

Simultaneously, n type diffusion region 19a is formed directly under field oxide film 6. The diffusion depth of n type diffusion region 19a starting from the lower surface of field oxide film 6 is approximately 1.0 to 2.0 µm. The plan width W3 of n type diffusion region 19a is smaller than the width W4 of field oxide film 6. As a result, it is possible to form region 22.

Figure 19:
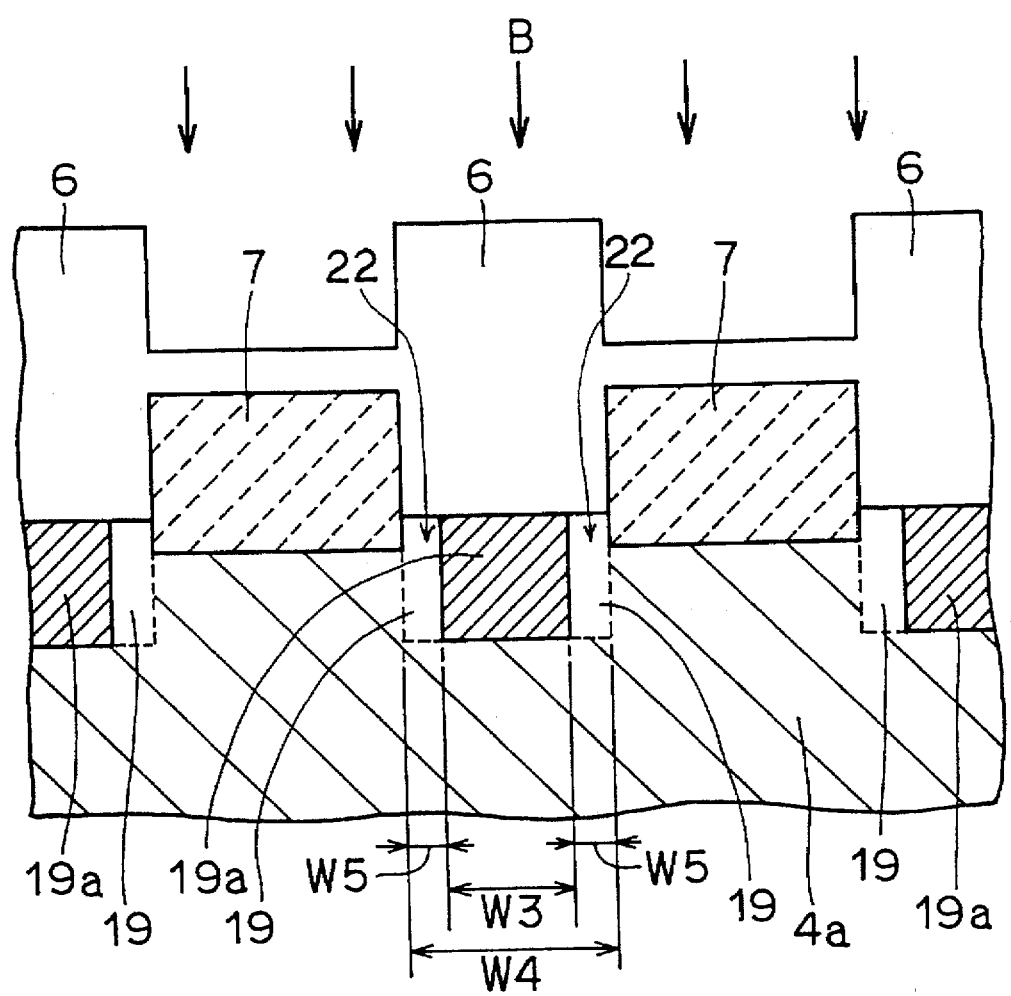
Figure 20:
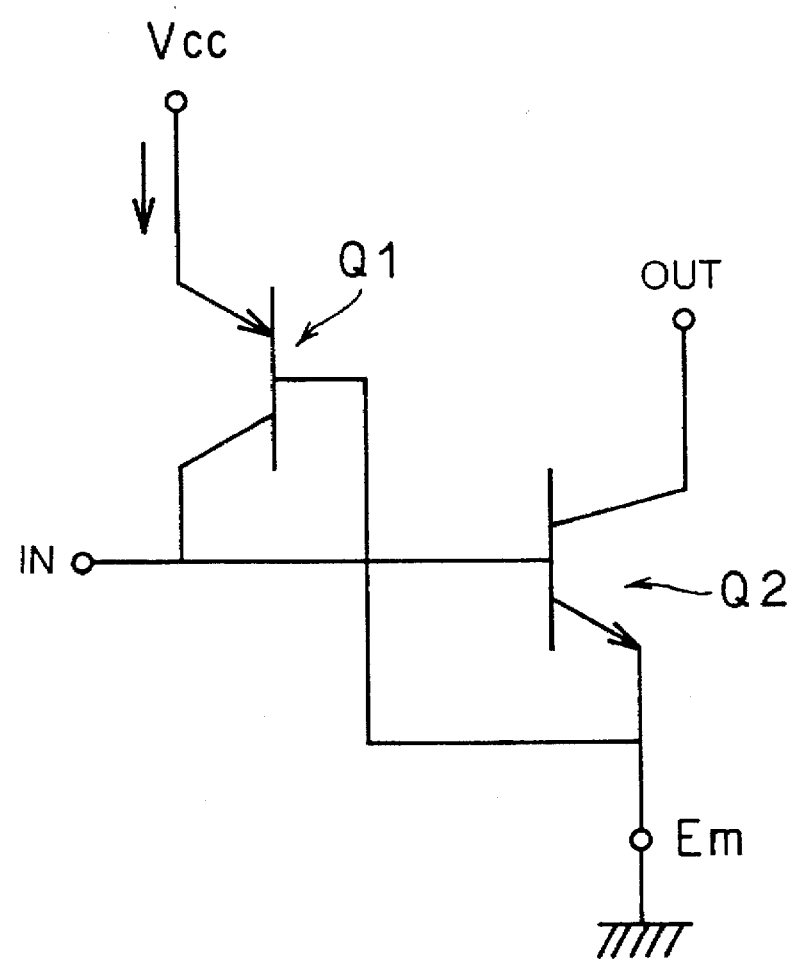
FIG. 20 is an equivalent circuit diagram showing an example of a conventional IIL circuit.

Referring to FIG. 19, with a method similar to the case of the first embodiment, with field oxide film 6 used as a mask, p type impurity such as boron (B) is implanted into the surface of n type epitaxial layer 4a. As a result, base region 7 is formed.

Since n type diffusion region 19a is formed so that both end portions are offset inside by the width W5 from both side walls of field oxide film 6, it is possible to form base region 7 and n type diffusion region 19a at a predetermined interval to each other. As a result, it is possible to improve the junction breakdown voltage between base region 7 and n type diffusion region 19a compared to the case of the first embodiment.

As shown in FIG. 19, by forming region 22, it is possible to set the concentration of impurity included in n type diffusion region 19a higher. More specifically, the concentration can be set to greater than $10^{17}$ cm$^{-3}$. As a result, it is possible to suppress the parasitic bipolar operation more than the case of the first embodiment.

If p type and n type are exchanged in each embodiment described above, the similar effect can be obtained.

As described above, according to a semiconductor device having an IIL circuit of the present invention, by forming an impurity region directly under an element isolation insulating layer, it is possible to effectively suppress the parasitic bipolar operation between base regions. As a result, it is possible to reduce the interval between base regions compared to the conventional case shown in FIG. 21. Furthermore, since the impurity region is formed under the element isolation insulating layer, the junction capacitance between the base region and a semiconductor layer will not increase substantially. As a result, it is possible to obtain a semiconductor device having an IIL circuit which is reduced in size and has high reliability without lowering performance.

According to a method of manufacturing a semiconductor device having an IIL circuit of the present invention, it is possible to form an impurity region having the concentration peak of impurity in the vicinity of the lower surface of an element isolation insulating layer simultaneously with formation of the element isolation insulating layer. As a result, it is possible to obtain a semiconductor device having an IIL circuit in which the parasitic bipolar transistor is effectively suppressed, without increasing the manufacturing cost substantially. When the element isolation insulating layer and the impurity region are formed using mask layers having a same mask pattern, it is not necessary to form a new mask layer for forming the impurity region. As a result, it is possible to suppress increase in the manufacturing cost in forming the impurity region.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having an IIL circuit, comprising the steps of:

forming a buried layer of the second conductivity type in a semiconductor substrate;

forming an emitter layer of a second conductivity type in a main surface of the semiconductor substrate of a first conductivity type;

forming a mask layer of a shape on a surface of said emitter layer;

introducing impurity of the second conductivity type into the surface of said emitter layer using said mask layer as a mask;

forming an element isolation insulating region for separating base regions in the surface of said emitter layer and an impurity region of the second conductivity type in a region in said emitter layer positioned directly under said element isolation insulating region and spaced apart from said buried layer of the second conductivity type, by applying thermal treatment to the surface of said emitter layer with a part of said mask layer used as a mask;

removing said mask layer;

forming a base region of the first conductivity type by introducing impurity of the first conductivity type into a region in the surface of said emitter layer with said element isolation insulating region used as a mask; and forming a collector region of the second conductivity type by selectively introducing impurity of the second conductivity type into a surface of said base region.

2. The method of manufacturing a semiconductor device having an IIL circuit as recited in claim 1, wherein said step of forming a mask layer includes the steps of forming a silicon oxide film on the surface of said emitter layer, forming a silicon nitride film on the silicon oxide film, forming a resist pattern patterned into a shape on said silicon nitride film, and patterning said silicon nitride film into a shape with said resist pattern used as a mask, and said step of introducing impurity of the second conductivity type into the surface of said emitter layer includes the step of removing said resist pattern after introducing said impurity of the second conductivity type into the surface of said emitter layer.

3. A method of manufacturing a semiconductor device having an IIL circuit, comprising the steps of:

forming a buried layer of the second conductivity type in a semiconductor substrate;

forming an emitter layer of a second conductivity type on a main surface of a semiconductor substrate of the first conductivity type;

forming a first mask layer patterned into a shape in a surface of said emitter layer;

introducing impurity of the second conductivity type into the surface of said emitter layer with said first mask layer used as a mask;

removing said first mask layer;

forming a second mask layer patterned into a shape on the surface of said emitter layer;

selectively forming an element isolation insulating region for separating base regions in the surface of said emitter layer and forming an impurity region of the second conductivity type in a region in said emitter layer positioned directly under said element isolation insulating region and spaced apart from said buried layer of the second conductivity type, by applying thermal treatment to said emitter layer with said second mask layer used as a mask;

removing said second mask layer;

forming a base region of a first conductivity type by introducing impurity of the first conductivity type into a region in the surface of said emitter layer with said element isolation insulating region used as a mask; and forming a collector region of the second conductivity type by selectively introducing impurity of the second conductivity type into a surface of said base region.

4. The method of manufacturing a semiconductor device having an IIL circuit as recited in claim 3, wherein said first mask layer has an opening portion of a first opening width exposing a first region in the surface of said emitter layer, and said second mask layer has an opening portion having a second opening width larger than said first opening width, and exposing said first region and a second region in the surface of said emitter layer surrounding said first region.

* * * * *